United States Patent [19]

Harmon, Jr.

[11] 4,415,961

[45] Nov. 15, 1983

[54] TELEPHONE RINGING SIGNAL GENERATOR

[75] Inventor: William R. Harmon, Jr., Burlington, N.C.

[73] Assignee: Bell Telephone Laboratories, Incorporated, Murray Hill, N.J.

[21] Appl. No.: 296,307

[22] Filed: Aug. 26, 1981

[51] Int. Cl.[3] ............................................. H03K 3/51
[52] U.S. Cl. ..................................... 363/43; 307/108
[58] Field of Search ............... 307/106, 108, 107, 151; 363/43; 320/15, 16, 17

[56] References Cited

U.S. PATENT DOCUMENTS

| | | | |
|---|---|---|---|
| 3,553,479 | 1/1971 | Nelson | 307/110 |
| 4,015,091 | 3/1977 | Rao et al. | 179/84 |
| 4,135,235 | 1/1979 | Baker | 363/43 |
| 4,203,151 | 5/1980 | Baker | 363/43 |

*Primary Examiner*—Elliot A. Goldberg
*Assistant Examiner*—Todd E. DeBoer
*Attorney, Agent, or Firm*—Gregory C. Ranieri

[57] ABSTRACT

A waveform generator (FIG. 1) contains a static energy storage device circuit in which storage devices (C1 through C6) are interconnected in a fixed topological configuration. The storage device circuit has a plurality of input and output terminals (12 through 18). Charge storage is accomplished by controllably steering (20, 40) a supplied DC signal (10a,b) to a selected one, or selected ones, of the storage devices via the appropriate input terminals. AC waveforms are generated (11a,b) by controllably selecting (30, 40), in predetermined sequence, each output terminal of the storage device circuit.

6 Claims, 2 Drawing Figures

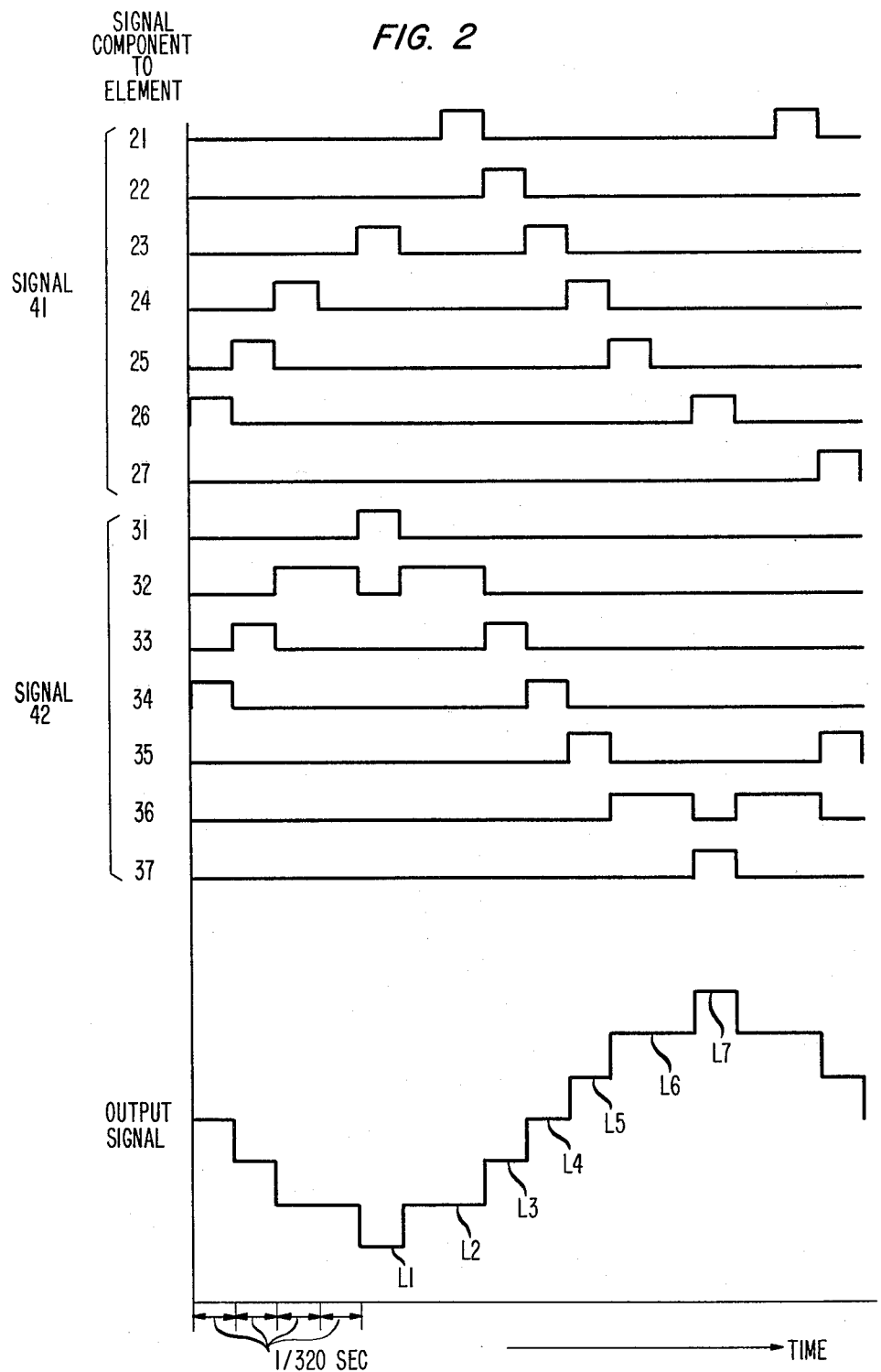

TELEPHONE RINGING SIGNAL GENERATOR

TECHNICAL FIELD

This invention relates to a DC-AC conversion device for waveform generation and, more particularly, to an electronic ringing generator for providing ringing signals in a telephone communication system.

BACKGROUND OF THE INVENTION

Rotating machines have been a traditional source of both supply power for ringing telephones and tones for signaling to a subscriber on the progress of a call. These machines included a battery driven DC motor connected to an AC alternator.

Now, however, modern semiconductor technology has been applied in this area to develop completely static ringing and tone generation devices. Power inverters, energized from a DC source, generate 20 Hz ringing signals, while oscillators and amplifiers generate the various tone signals. The inverters employ transistors or thyristors as well as step-up transformers to convert the direct current supplied from a battery to an alternating current ringing signal.

In order to avoid the use of magnetic core transformers and other inductive elements, static energy storage devices such as capacitors have been employed to perform basic energy conversion functions. Capacitor circuits provide DC-AC conversion via polarity reversal, step-up, and step-down functions, for example. An arrangement utilizing a capacitor circuit is shown in U.S. Pat. No. 3,553,479 issued to D. Nelson on Jan. 5, 1971. However, known arrangements such as the one shown in U.S. Pat. No. 3,553,479 require the use of complex switching apparatus to alter the topology of fthe capacitor circuit during charging and discharging cycles. Generally, these topological alterations include changing the connection of a capacitor circuit from series to parallel and vice versa.

SUMMARY OF THE INVENTION

Implementation of a waveform generator utilizing static energy storage devices is realized in accordance with the invention without the need for topological alterations to the static energy storage device circuit during charge and discharge cycles. The static energy storage device circuit maintains a fixed topology accessible via multiple input and output terminals. Charging of the storage devices is accomplished by controllably steering a DC source signal to a selected one, or selected ones, of the storage devices via the appropriate input terminals. Output AC waveforms are generated in stepwise fashion by controllably selecting, in a predetermined sequence, each output terminal of the storage device circuit.

In one embodiment of the invention, capacitors are connected in series to form the static energy storage device circuit. Each capacitor terminal is both an input terminal and an output for the circuit. Charge storage occurs when an input switching matrix responds to a first control signal to steer a supplied DC signal to each capacitor in the storage device circuit. When the charge storage is complete, an output switching matrix generates a stepwise representation of the desired waveform in response to a second control signal by sequentially transferring a voltage level selected from a particular output terminal of the storage device circuit. Specifically, the waveform generator generates a 20 Hz ringing signal from a $-48$ VDC office battery.

BRIEF DESCRIPTION OF THE DRAWINGS

A more complete understanding of the invention may be obtained by reading the following description of a specific illustrative embodiment of the invention in conjunction with the appended drawings in which:

FIG. 2 is a timing diagram showing exemplary signals employed and generated by the waveform generator of FIG. 1.

DETAILED DESCRIPTION

Figure 1:
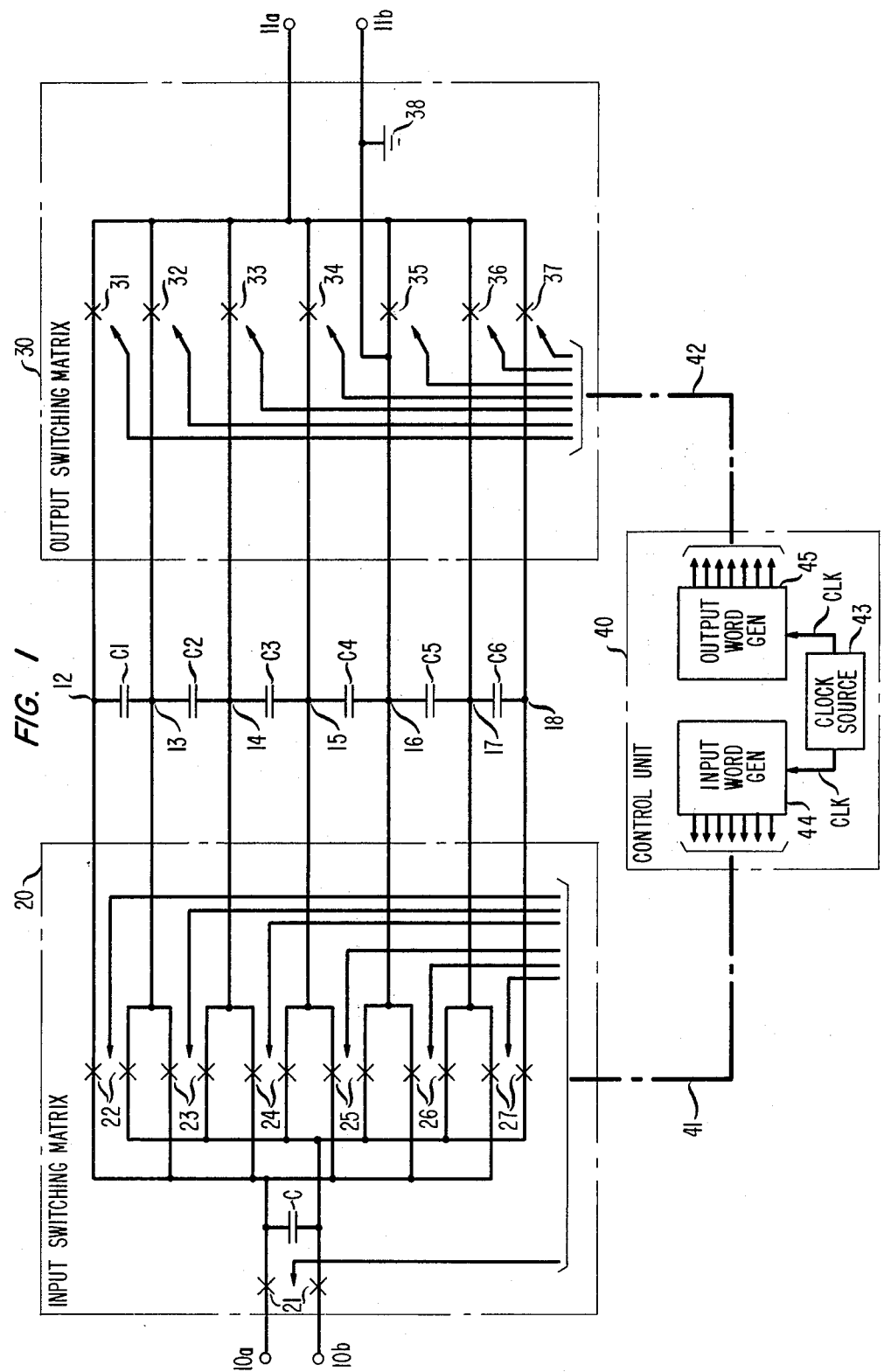
FIG. 1 is a schematic diagram of a waveform generator embodying the principles of the invention.

Switched network functions in telephone communications systems are implemented by transmitting control signaling information via alerting signals, address signals and supervisory signals. These signals are usually transmitted over loops or trunks directly involved in an overall connection. However, transmission may also occur over a separate, dedicated signaling channel used as a common signaling facility for many message channels.

Alerting signals are relevant to the present invention because they include, among others, ringing signals. The ringing signal is supplied to a subscriber loop to alert a subscriber that an incoming call is on the line. Incoming calls are usually indicated by alerting in the form of a ringing bell.

Ringing is accomplished by transmitting an AC signal at a nominal frequency of 20 Hz over the subscriber loop from a central office to the subscriber's telephone station. Generation of the ringing signal occurs in apparatus of the type shown in FIG. 1, which is located at the central office. Although the embodiment in FIG. 1 is used in connection with a central office, the ringing generator is equally applicable to private branch exchanges or key telephone systems.

FIG. 1 shows a waveform generator adapted for operation as a telephone ringing signal generator in a normal superimposed ringing mode. In this embodiment, waveform generation is achieved in two separate operations: DC-DC conversion and DC-AC conversion. The waveform generator includes input switching matrix 20, output switching matrix 30, control unit 40 and a plurality of storage devices, capacitors C1 and C6, connected in a fixed topological configuration such as series connection. Charging of the storage devices is achieved in a selective and sequential manner as opposed to the simultaneous manner employed by non-fixed topology circuits. A DC signal supplied to input terminals 10a and 10b of switching array 20 is steered to a selected pair of capacitor terminals for replenishing the charge on the capacitor or capacitors therebetween. Output switching matrix 30 connects a particular voltage level present at the selected capacitor terminal, or at the junction between two capacitors, to output terminal 11a, thereby generating a stepwise representation of the waveform of interest. The waveform generated at output terminals 11a and 11b depends upon the order in which various capacitor terminals are selected, the speed of this selection, and the charge stored by the capacitors, individually and in combination. Speed of selection and order of selection are regulated by control unit 40 and, more specifically, by the control signals it generates and transmits to each switching matrix.

The storage devices shown in FIG. 1 are capacitors C1 through C6, which are permanently connected in series. Although the capacitors are connected together, each capacitor is capable of being charged individually without disturbing or altering any connection. Selection of the capacitor terminals, to which the input DC voltage is applied, is performed by input switching matrix 20 in response to first control signal 41 from control unit 40. When capacitor terminals 12 and 13 are selected for applying a DC voltage, i.e., switching element 22 activated, charge is stored only on capacitor C1. Similarly, selection of capacitor terminals 14 and 15, i.e., activation of switching element 24, causes charge to be stored only on capacitor C3.

Input switching matrix 20 includes a plurality of switching elements and a large charge storage element, capacitor C, which combine to perform the DC-DC conversion by steering a DC voltage to a pair of capacitor terminals as directed by control signal 41. Switching matrix 20 also isolates the input DC signal source from the storage device circuit to avoid excess loading problems. All switching elements shown in FIG. 1 are in a normally open condition. Although certain switching elements are coupled together to operate in unison, it is known that, for other applications, each switching element can be decoupled and individually controllable. The switching elements are realizable as relays, high energy crosspoints, or analog transmission gates.

Switching element 21 responds to a high level (see FIG. 2) of control signal 41 to close momentarily and to connect the input DC signal on terminals 10a and 10b across capacitor C. During the time period that switching element 21 is closed, the DC input signal having an amplitude of $E_i$ volts is impressed across capacitor C. Capacitor C then stores a charge of $E_iC$ coulombs. After switching element 21 opens, switching elements 22 through 27 are allowed to be closed in sequence. Mutually exclusive closure periods for element 21 and the remaining switching elements in input switching matrix 20 ensures isolation of the source of the DC input signal at terminals 10a and 10b from storage devices C1 through C6. The size of capacitor C is partially determined by the speed at which switching matrix 20 operates and also by the expected need for rapid charge replenishment of capacitors C1 through C6. Capacitor C has a much larger capacitance than each of capacitors C1 through C6. For example, capacitor C has approximately ten times the capacitance of capacitor C1, and capacitor C1 is equal in capacitance to capacitors C2, C3, C4, C5 and C6, individually. This ensures equality of amplitude level transitions between adjacent steps in the generated output waveform.

Closure of switching element 22 in response to signal 41 causes charge to be transferred to capacitor C1. The charge is transferred during a time period sufficient for a voltage $E_i$ to appear across terminals 12 and 13. Similarly, closure of switches 23, 24, 25, 26 and 27 for mutually exclusive time intervals causes a charge transfer from capacitor C to each of capacitors C2, C3, C4, C5 and C6, respectively. By inspection, the input voltage $E_i$ also appears across each pair of terminals 13-14, 14-15, 15-16, 16-17, and 17-18. The following table illustrates the voltage measured with respect to ground at each of terminals 12 through 18 when terminal 10a is measured at $-E_i$ volts.

| TERMINAL | OUTPUT VOLTAGE | LEVEL | SWITCHING ELEMENT |
|---|---|---|---|
| 12 | $-4E_i$ | L1 | 31 |
| 13 | $-3E_i$ | L2 | 32 |
| 14 | $-2E_i$ | L3 | 33 |
| 15 | $-E_i$ | L4 | 34 |
| 16 | 0 | L5 | 35 |
| 17 | $E_i$ | L6 | 36 |
| 18 | $2E_i$ | L7 | 37 |

Clearly, input switching matrix 20 and capacitors C1 through C6 combine to perform a voltage step-up function by capacitive rather than inductive means.

After capacitors C1 through C6 are initially charged to the appropriate levels, input switching matrix 20 is utilized as necessary to replenish any charge depleted from these capacitors. Charge replenishment ensures that a predetermined voltage continuously exists at each capacitor terminal 12 through 18. In the example shown in the FIGURES, incremental voltage changes between successively adjacent capacitor terminals and in the output signal are uniformly controlled to be equal by timely charge replenishment of partially or fully discharged capacitors C and C1 through C6.

Output switching matrix 30 facilitates the connection of output terminals 11a-b, or terminal 11a alone, to each capacitor terminal in a predetermined sequence. Sequencing of these connections is determined by control signal 42 which is shown in more detail in FIG. 2. A stepwise signal representing the waveform of interest is generated at the output of switching matrix 30.

Output switching matrix 30 includes a plurality of switching elements. Each switching element 31 through 37 is connected on a one-to-one basis between one capacitor terminal (terminals 12 through 18, respectively) and output terminal 11a. See the table included above. Closure of a switching element in matrix 30 causes the voltage apparent at the respective capacitor terminal to be output at terminal 11a. Output terminal 11b is connected directly to ground terminal 38 for providing the superimposed ringing mode of operation. Output terminals 11a and 11b can float or be referenced, as in this example, to an available AC or DC voltage source in order to provide other suitable modes of operation or output waveforms.

Control unit 40 generates control signals 41 and 42 to control the operation of each switching element in input switching matrix 20 and output switching matrix 30, respectively. Included in control unit 40 are clock source 43, input word generator 44, and output word generator 45. Control signals 41 and 42 are each separately comprised of a plurality of component signals as shown in FIG. 2. Each component signal controls the operation of a single switching element or a pair of coupled switching elements.

Clock source 43 provides clock reference signal CLK to word generators 44 and 45. Reference signal CLK is usually a square wave AC signal, although sinusoidal clock signals and the like are equally applicable. The frequency of reference signal CLK is related to the frequency of the output signal generated at terminals 11a-b. Usually, this relationship is based upon the shortest time interval during which a fundamental operation, such as closure of a switching element, is performed. For the example shown in FIG. 2, a 20 Hz sine wave is generated, and the shortest time interval for a fundamental operation was 1/320 sec. Hence, reference signal CLK has a frequency of 320 Hz.

Input word generator 44 responds to signal CLK to transmit the separate components of control signal 41 to the corresponding switching elements of input switching matrix 20. Input word generator 44 is of the type of externally clocked, presettable word or pattern generator well known in the art. In one example from experimental practice, input word generator 44 is comprised of seven multistage serial shift registers. Each register generates one of the seven components of signal 41 (see FIG. 2). The first stage and the last stage of each shift register are wired together to produce a "wraparound" effect or cyclic shift of the register contents at each pulse of signal CLK. In general, each shift register has N stages, where N is an integer equal to the frequency of reference signal CLK divided by the frequency of the output waveform signal, i.e., 320 Hz/20 Hz or 16. The contents of each shift register are output serially to the respective switching element. As shown in FIG. 2, the binary contents of the shift register corresponding to the component of signal 41 transmitted to switching element 21 are 0000001000000010. A positive pulse (high level, binary '1') causes the particular switching element to close its contacts or, simply, complete the connection.

Output word generator 45 in FIG. 1 also responds to signal CLK for generating and transmitting the separate components of control signal 42 to the corresponding switching elements of output switching matrix 30. Output word generator 45 is also an externally clocked, presettable word or pattern generator similar, in nature, to generator 44 previously described. In this example, generator 45 is exactly the same as generator 44 except for the contents of its shift registers, as evidenced by the signal components in FIG. 2. For example, the component of signal 42 transmitted to switching element 32 corresponds to the following word contained in a shift register of generator 45: 0011011000000000.

In FIG. 2, the separate components of control signals 41 and 42 are shown along with the output signal from the waveform generator. The separate components of signals 41 and 42 are depicted as binary signals. Of course, the method of control signaling, binary or otherwise, is dependent on the type of switching element selected for use in switching matrices 20 and 30. As stated above, a positive pulse (binary '1') in a component of either control signal 41 or 42 causes closure of the particular corresponding switching element.

The output signal shown in FIG. 2 is a stepwise continuous representation of a 20 Hz sinusoidal superimposed (DC offset) ringing signal. The time scale is divided into 1/320 sec. intervals. Each amplitude level of the output signal is uniformly spaced from adjacent levels so that all steps between adjacent levels are equal. That is, level L2 is equally spaced from levels L1 and L3, level L3 is equally spaced from levels L2 and L4, and so on. See table included above.

The waveform generator in FIG. 1 is also capable of being adapted to generate stepwise continuous signals having nonuniform steps between adjacent levels, or to increase the resolution (smoothness) of the output signal, or to change the frequency of the output signal, or even to generate other waveshapes such as triangles, random or the like. Other modifications of the invention shown in FIG. 1 include decoupling presently coupled pairs of switching elements in switching matrix 20 to allow selection of nonadjacent capacitor terminals during charge replenishment. It is apparent to those skilled in the art that these and other obvious modifications of the waveform generator in FIG. 1 can be made without departing from the spirit and scope of the invention.

What is claimed is:

1. A waveform generator (FIG. 1) for converting a supplied direct current signal (10a, 10b) into an alternating current signal (11a, 11b), the generator being characterized by,
   means (40) for generating first (41) and second (42) control signals,
   a plurality of means (C1 through C6), each having at least two terminals (12 through 18) connected in a fixed circuit configuration for storing an amplitude representation of a signal applied thereto,
   means (20) responsive to the first control signal for selectively steering the supplied direct control signal to the plurality of storage means,
   means responsive to the first control signal for controllably isolating said steering means from the supplied direct current signal, and
   selection means (30) responsive to the second control signal for transferring a stored amplitude representation from selected terminals to generate the alternating current signal.

2. The waveform generator defined in claim 1 wherein each storage means is a capacitor.

3. A waveform generator (FIG. 1) for converting a supplied direct current signal (10a, 10b) into an alternating current signal (11a, 11b), the generator being characterized by
   means for generating first (41) and second (42) control signals,
   means (20, C1 through C6) responsive to the first control signal for converting the supplied direct current signal into a plurality of different amplitude levels,
   means responsive to the first control signal for controllably isolating said converting means from the supplied direct current signal, and
   means (30) responsive to the second control signal for selecting an amplitude level of the plurality of amplitude levels to be coupled to the generator output for a predetermined duration so that a stepwise continuous alternating current signal is thereby generated.

4. The generator as defined in claim 3 wherein the converting means includes means (C1 through C6) for storing the plurality of levels.

5. The generator as defined in claim 4 wherein the storage means includes a plurality of capacitors each having at least two terminals connected in a fixed circuit configuration.

6. The generator as defined in claim 5 wherein the fixed circuit configuration is a series circuit connection of the plurality of capacitors.

* * * * *